(12) United States Patent
Klein et al.

(10) Patent No.: US 8,334,712 B2
(45) Date of Patent: Dec. 18, 2012

(54) HIGH SPEED LATCH CIRCUIT WITH METASTABILITY TRAP AND FILTER

(75) Inventors: Avi Klein, Elazar (IL); Migel Jacubovski, Hod Hasharon (IL)

(73) Assignee: Microsemi Corp.—Analog Mixed Signal Group Ltd., Hod Hasharon (IL)

( * ) Notice: Subject to any disclaimer, the term of this patent is extended or adjusted under 35 U.S.C. 154(b) by 88 days.

(21) Appl. No.: 13/036,033

(22) Filed: Feb. 28, 2011

(65) Prior Publication Data

US 2011/0215852 A1    Sep. 8, 2011

Related U.S. Application Data

(60) Provisional application No. 61/310,314, filed on Mar. 4, 2010.

(51) Int. Cl.
*H03L 7/00* (2006.01)
(52) U.S. Cl. .......... 327/141; 327/218; 327/219
(58) Field of Classification Search .......... 327/141, 327/218, 219
See application file for complete search history.

(56) References Cited

U.S. PATENT DOCUMENTS

| | | | |
|---|---|---|---|
| 5,691,659 A * | 11/1997 | Riley | 327/143 |
| 6,642,763 B2 | 11/2003 | Dike | |
| 6,781,429 B1 | 8/2004 | Smith | |
| 6,924,682 B1 | 8/2005 | Smith | |

\* cited by examiner

*Primary Examiner* — John Poos
(74) *Attorney, Agent, or Firm* — Simon Kahn

(57) ABSTRACT

A synchronizer constituted of a first and second set of three serially coupled latches coupled to a common clocking signal, the first and the ultimate latch of the first set responsive to a first edge of a common clocking signal and the penultimate latch responsive to an opposing edge of the common clocking signal, the second set being respectively responsive to the respective complementary edges of the clocking signal; an input lead arranged to receive a signal to be synchronized, the input lead coupled to the input of the first latch of the first set and to the input of the first latch of the second set; and a filter arranged to pass the output of each of the first set and the second set responsive to the penultimate latch of the set exhibiting a consistent output for two consecutive opposing edges.

21 Claims, 3 Drawing Sheets

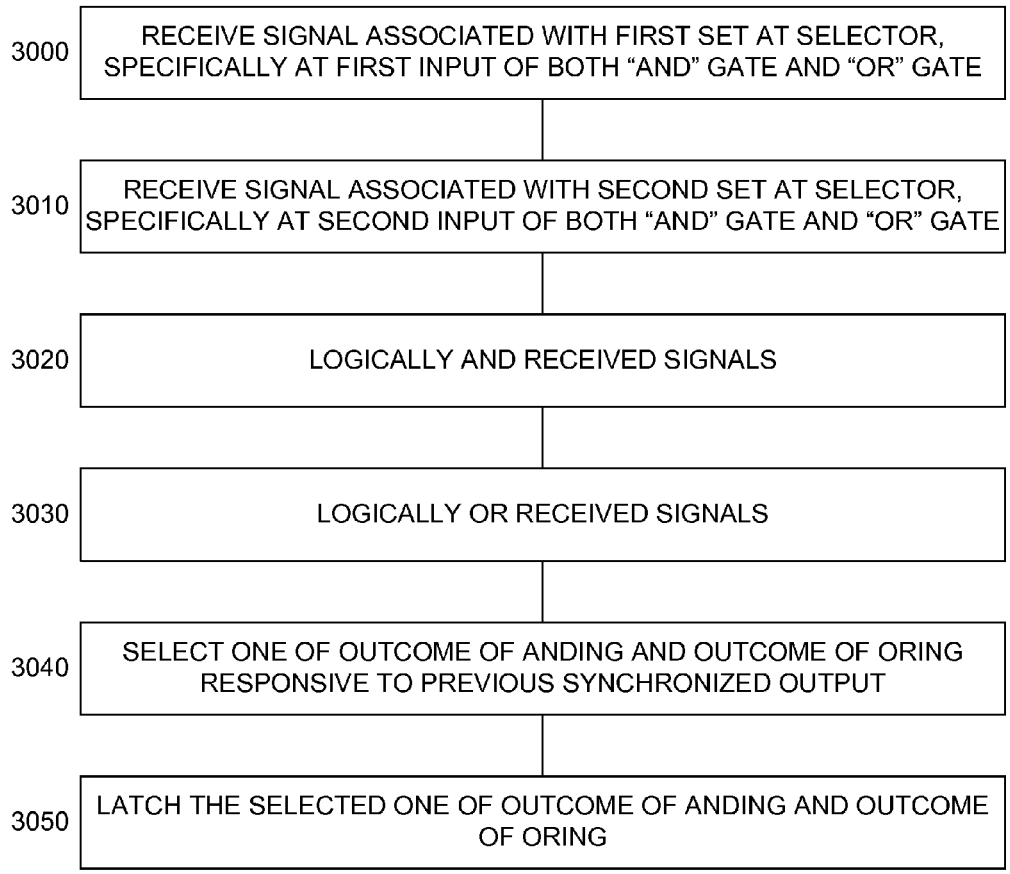

HIGH SPEED LATCH CIRCUIT WITH METASTABILITY TRAP AND FILTER

TECHNICAL FIELD

The present invention relates to the field of signals passing between portions of a digital system in the absence of a single synchronous clock signal, and more particularly to a synchronizing and meta-stable state trap.

BACKGROUND

Digital systems typically work on a synchronous clock edge. Thus, provided that propagation delays and set up time are properly determined, on the appropriate clock edge a determined signal state received at an input of a latching device will properly propagate to the output of the latching device.

Communication of a digital signal often must be accomplished between subsystems which do not share a common clock, and thus the received digital signal is essentially asynchronous to the receiving subsystem. In the event that the change in state of the received signal does not meet the setup and hold requirements of the receiving latching device prior to the clocking signal of the receiving latching device, the receiving latching device may present a metastable state, i.e. the output of the receiving latching device may oscillate for a predetermined amount of time until settling into a particular state. Furthermore, there is no guarantee that the ultimate particular state is reflective of the state of the received signal at the time of the clocking signal.

Synchronizers are known devices whose function is to capture an incoming signal, and synchronize changes in the incoming signal to a local common clock. In order to resolve the above described metastability problem, synchronizers of the prior art typically require a plurality of complete clock cycles to process an incoming signal. This leads to delays and is thus not desirable.

What is desired is a synchronizer arranged to rapidly detect a change in state in an incoming asynchronous signal so as to resolve any metastability with minimal latency.

SUMMARY

In view of the discussion provided above and other considerations, the present disclosure provides methods and an apparatus to overcome some or all of the disadvantages of prior and present synchronizers. Other new and useful advantages of the present methods and apparatus will also be described herein and can be appreciated by those skilled in the art.

This is provided in certain embodiments by a first set of three serially connected latches and a second set of three serially connected latches, each latch of each of the first and second set of three serially connected latches being arranged to clock on an alternate clock edge from the preceding latch. The operative clock edges of the latches of the first set are out of phase with the clock edges of the respective latches of the second set. The first latch of each of the first set and the second set are coupled to receive the incoming signal.

The output of the ultimate latch of the first set is passed through a first filter portion, the first filter portion arranged to pass the output of the ultimate latch of the first set only in the event that the output of the ultimate latch of the first set matches the output of the penultimate latch of the first set. In the event that the output of the ultimate latch of the first set does not match the output of the penultimate latch of the first set, the previous latched value is output from the first filter portion.

The output of the ultimate latch of the second set is passed through a second filter portion, the second filter portion arranged to pass the output of the ultimate latch of the second set only in the event that the output of the ultimate latch of the second set matches the output of the penultimate latch of the second set. In the event that the output of the ultimate latch of the second set does not match the output of the penultimate latch of the second set, the previous latched value is output from the second filter.

The output of the first filter portion is logically ORed with the output of the second filter portion, and the ORed output is fed into a first input of an output multiplexer. The output of the first filter portion is further logically ANDed with the output of the second filter portion, and the ANDed output is fed to a second input of the output multiplexer. The output multiplexer is controlled by the previous latched value, such that a logical 1 state of the previous latched value will pass the ANDed output and a logical 0 state of the previous latched value will pass the ORed output. Thus, in the event that the previous latched value is a logical 1, the ANDed output will be passed, such that a logical 0 output from either the first filter portion or the second filter portion will be passed through the output multiplexer. In the event that the previous latched value is a logical 0, the ORed output will be passed, such that a logical 1 output from either the first filter portion or the second filter portion will be passed through the output multiplexer.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 2C illustrates a more detailed high level flow chart of a second portion of the method of FIG. 2A; and FIG. 2D illustrates a truth table of the outputs of specific elements of the synchronizer of FIG. 1.

DETAILED DESCRIPTION OF PREFERRED EMBODIMENTS

Figure 1:
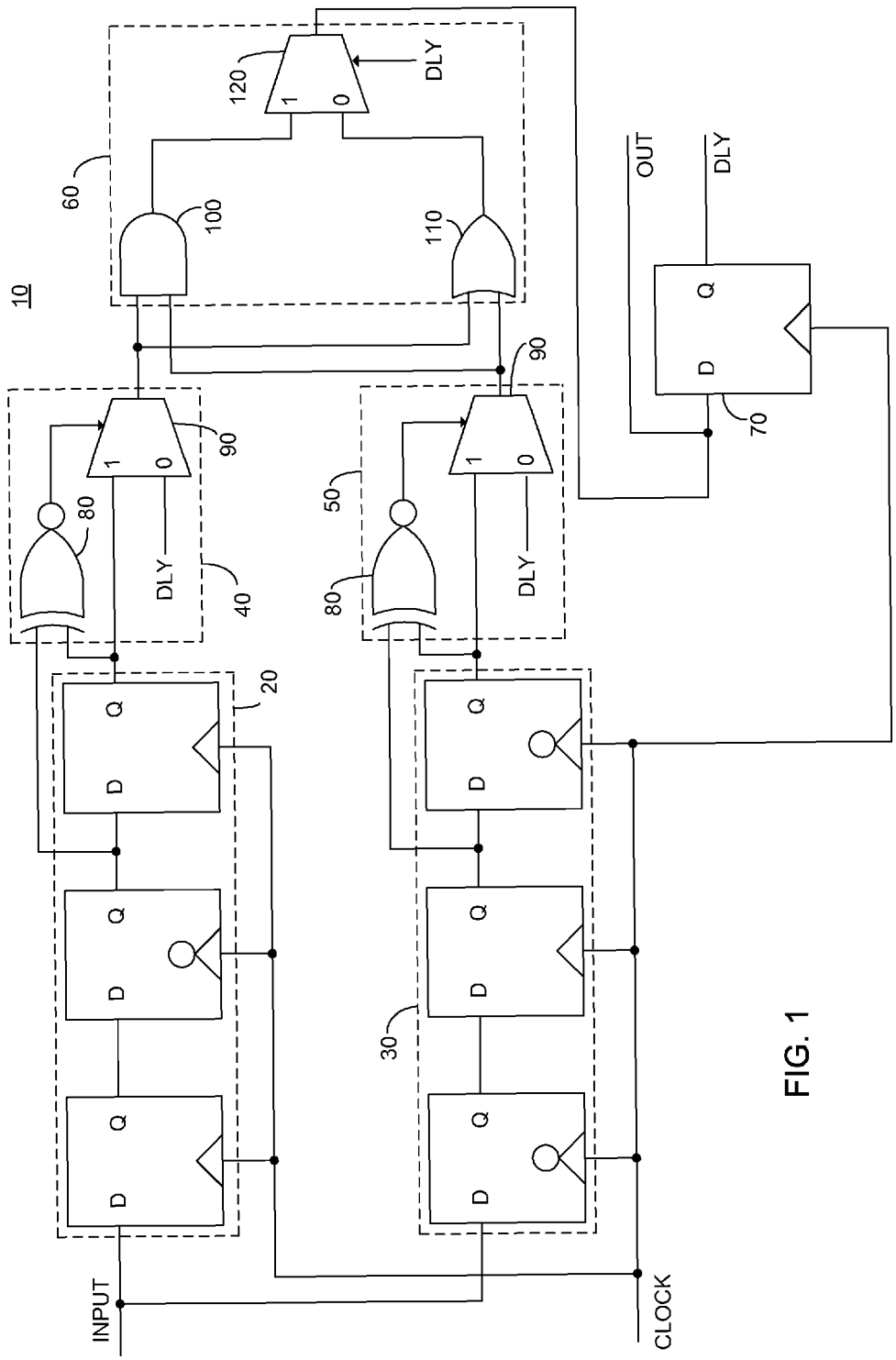
FIG. 1 illustrates a high level schematic diagram of a synchronizer according to certain embodiments.

Before explaining at least one embodiment in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. The term connected as used herein is not meant to be limited to a direct connection, and the use of appropriate resistors, capacitors and inductors does not exceed the scope thereof.

FIG. 1 illustrates a high level schematic diagram of a synchronizer 10, comprising: a first set of latches 20, comprising three serially coupled latches; a second set of latches 30, comprising three serially coupled latches; a first filter portion 40; a second filter portion 50; a selector 60; and an output latch 70. In one embodiment the serially coupled latches are comprised of D flip-flops. First filter portion 40 and second filter portion 50 each comprise an exclusive nor (XNOR) gate 80 and a multiplexer 90. Selector 60 comprises an AND gate 100, an OR gate 110, and an output multiplexer 120. In one embodiment output latch 70 comprises a D flip-flop.

The output of each constituent latch of first set of latches 20 is connected to the input of the subsequent latch and the output of each constituent latch of second set of latches 30 is connected to the input of the subsequent latch. The clock input of each latch of first set of latches 20 and second set of latches 30 is connected to a common clocking signal, denoted CLOCK, exhibiting a first and a second edge, occurring periodically, with the first edge opposing the second edge. The first and ultimate latch of first set of latches 20 is responsive to the first edge of common clocking signal CLOCK and the penultimate latch of first set of latches 20 is responsive to the second edge of common clocking signal CLOCK. The first and ultimate latch of second set of latches 30 is responsive to the second edge of common clocking signal CLOCK and the penultimate latch of second set of latches 30 is responsive to the first edge of common clocking signal CLOCK. The input of the first latch of each of first set of latches 20 and second set of latches 30 is connected to an input signal, denoted INPUT. The output of the penultimate latch of first set of latches 20 is further connected to a first input of XNOR gate 80 of first filter portion 40 and the output of the penultimate latch of second set of latches 30 is further connected to a first input of XNOR gate 80 of second filter portion 50. The output of the ultimate latch of first set of latches 20 is further connected to a second input of XNOR gate 80 of first filter portion 40 and to a first multiplexed input of multiplexer 90 of first filter portion 40. The output of the ultimate latch of second set of latches 30 is further connected to a second input of XNOR gate 80 of second filter portion 50 and to a first multiplexed input of multiplexer 90 of second filter portion 50. The output of XNOR gate 80 of first filter portion 40 is connected to the control input of multiplexer 90 of first filter portion 40 and the output of XNOR gate 80 of second filter portion 50 is connected to the control input of multiplexer 90 of second filter portion 50. A second multiplexed input of each multiplexer 90 of first filter portion 40 and second filter portion 50 is connected to the output of output latch 70.

The output of multiplexer 90 of first filter portion 40 is connected to a first input of AND gate 100 and to a first input of OR gate 110. The output of multiplexer 90 of second filter portion 50 is connected to a second input of AND gate 100 and to a second input of OR gate 110. The output of AND gate 100 is connected to a first multiplexed input of output multiplexer 120 and the output of OR gate 110 is connected to a second multiplexed input of output multiplexer 120. The control input of output multiplexer 120 is connected to the output of output latch 70. The output of output multiplexer 120 is connected to the input of output latch 70, and is denoted OUT, representing the synchronized signal. The clock input of output latch 70 is connected to common clocking signal CLOCK, and is responsive to the first edge thereof. The output of output latch 70 is denoted DLY.

For simplicity and clarity, the operation will be described in an embodiment wherein the first edge of CLOCK is the positive going edge and the second, or opposing, edge of CLOCK is the negative going edge, however this is not meant to be limiting in any way, and the reverse implementation may be provided without exceeding the scope.

In operation, a signal is received at the inputs of the first latch of each of first set of latches 20 and second set of latches 30. Responsive to the first occurrence of a positive going edge of common clocking signal CLOCK occurring after the signal has been stable and received, the signal is passed to the input of the penultimate latch of first set of latches 20. Responsive to the first occurrence of a negative going edge of common clocking signal CLOCK, occurring after the signal has been stable and received, the signal is passed to the input of the ultimate latch of first set of latches 20, the first input of XNOR gate 80 of first filter portion 40, and to the input of the penultimate latch of second set of latches 30. Responsive to the second positive going edge of common clocking signal CLOCK, the signal is passed to the second input of XNOR gate 80 of first filter portion 40, the first multiplexed input of multiplexer 90 of first filter portion 40, the input of the ultimate latch of second set of latches 30 and the first input of XNOR gate 80 of second filter portion 50. Responsive to the second negative going edge of common clocking signal CLOCK, the signal is passed to the second input of XNOR gate 80 of second filter portion 50 and to the first multiplexed input of multiplexer 90 of second filter portion 50. Thus, within 2 consecutive like clock edges after the signal has been stable and received, the signal appears at the output of the ultimate latch of either first set of latches 20 and second set of latches 30.

If the input signal was not stable for a set up time before the first positive going edge of common clocking signal CLOCK, the output of the first latch of first set of latches 20 after the first positive going edge of common clocking signal CLOCK is indeterminate. If the input signal was stable for the set up time before the first positive going edge of common clocking signal CLOCK, the signal will be passed to both the penultimate latch, and the ultimate latch of first set of latches 20 responsive to the second positive going edge of common clocking signal CLOCK.

If the input signal was not stable for a set up time before the first negative going edge of common clocking signal CLOCK, the output of the first latch of second set of latches 30 after the first negative going edge of common clocking signal CLOCK is indeterminate. If the input signal was stable for the set up time before the first negative going edge of common clocking signal CLOCK, the signal will be passed to both the penultimate latch, and the ultimate latch of second set of latches 30 responsive to the second negative going edge of common clocking signal CLOCK.

XNOR gate 80 of first filter portion 40 outputs a logical 1 responsive to the outputs of the ultimate and penultimate latches of first set of latches 20 being of the same value, and multiplexer 90 of first filter portion 40 is thereby operative to output the received signal to AND gate 100 and OR gate 110. If the received signal is not constant for two consecutive opposing clock edges, the signal output by the ultimate latch of first set of latches 20 is considered unstable, and XNOR gate 80 of first filter portion 40 outputs a logical 0 to the control input of multiplexer 90 of first filter portion 40, which is responsive thereto to pass signal DLY of output latch 70 to AND gate 100 and OR gate 110.

XNOR gate 80 of second filter portion 50 outputs a logical 1 responsive to the outputs of the ultimate and penultimate latches of second set of latches 30 being of the same value, and multiplexer 90 of second filter portion 50 is thereby operative to output the received signal to OR gate 110 and AND gate 100. If the received signal is not constant for two consecutive opposing clock edges, the signal output by the ultimate latch of second set of latches 30 is considered unstable, and XNOR gate 80 of second filter portion 50 outputs a logical 0 to the control input of multiplexer 90 of second filter portion 50, which is responsive thereto to pass signal DLY of output latch 70 to OR gate 110 and AND gate 100.

Selector 60 is operative to output a change of state in input signal INPUT, responsive to the first passed change of state through either the combination of first set of latches 20 and first filter portion 40 or the combination of second set of latches 30 and second filter portion 50. In the event that signal DLY is a logical 0, output multiplexer 120 passes the output of OR gate 110. If the output of both first filter portion 40 and second filter portion 50 remain at a logical 0, i.e. the same value as that of DLY, the output of selector 60 is logical 0, i.e. unchanged from the previous state held by output latch 70. If there is a change of state in input signal INPUT, i.e. the output of either first filter portion 40 or second filter portion 50 changes to a logical 1, OR gate 110 outputs a logical 1 to output latch 70, via output multiplexer 120, and the logical 1 appears at OUT. As described above, the output of first filter portion 40 is arranged to present changes in INPUT occurring before a positive going clock edge of common clocking signal CLOCK, after the second positive going clock edge of common clocking signal CLOCK, and the output of second filter portion 50 is arranged to present changes in INPUT occurring before a negative going clock edge of common clocking signal CLOCK, after the second negative going clock edge of common clocking signal CLOCK.

In the event that signal DLY is logical 1, output multiplexer 120 passes the output of AND gate 100. If the output of both first filter portion 40 and second filter portion 50 remain at a logical 1, i.e. the same value as that of DLY, the output of selector 60 is logical 1, i.e. unchanged from the previous state held by output latch 70. If there is a change of state in input signal INPUT, i.e. the output of either first filter portion 40 or second filter portion 50 changes to a logical 0, AND gate 100 outputs a logical 0 to output latch 70, via output multiplexer 120, and the logical 0 appears at OUT.

As described above, the output of first filter portion 40 is arranged to present changes in INPUT occurring before a positive going clock edge of common clocking signal CLOCK, after the second positive going clock edge of common clocking signal CLOCK, and the output of second filter portion 50 is arranged to present changes in INPUT occurring before a negative going clock edge of common clocking signal CLOCK, after the second negative going clock edge of common clocking signal CLOCK.

Figure 2A:
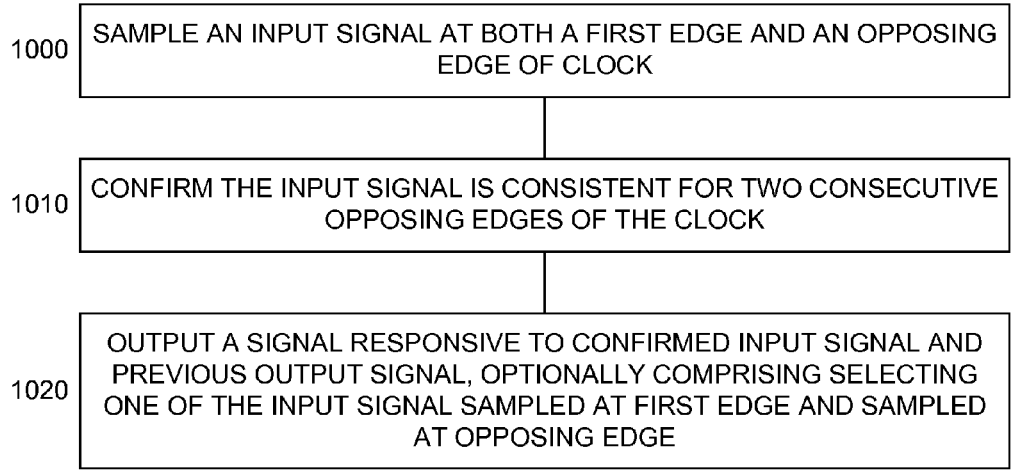
FIG. 2A illustrates a high level flow chart of a method of synchronizing an input signal according to certain embodiments.

FIG. 2A illustrates a high level flow chart of a method of synchronizing an input signal according to certain embodiments. In stage 1000 an input signal, such as input signal INPUT of FIG. 1, is sampled at both a first edge and the subsequent opposing edge of a common clocking signal, such as common clocking signal CLOCK of FIG. 1. In stage 1010 the sampled input signal of stage 1000 is confirmed as being of a consistent value for two consecutive opposing edges of the common clocking signal, as will be described further below in relation to FIG. 2B. In one embodiment the confirmation is accomplished by a filter, optionally being comprised of a first filter portion and a second filter portion, such as first filter portion 40 and second filter portion 50 of FIG. 1. In stage 1020 a signal is output responsive to a previous synchronized output value, such as signal DLY of FIG. 1, and the confirmed sampled input signal of stage 1010. Optionally, the confirmed sampled input signal is one of the input signal sampled at the first edge of the common clocking signal and the input signal sampled at the second edge of the common clocking signal, the outputting comprising selecting one of the input signal sampled at the first edge of the common clocking signal and the input signal sampled at the subsequent opposing edge of the common clocking signal, as will be further described below in relation to FIG. 2C. In one embodiment the selecting is accomplished by a selector, such as selector 60 of FIG. 1.

Figure 2B:
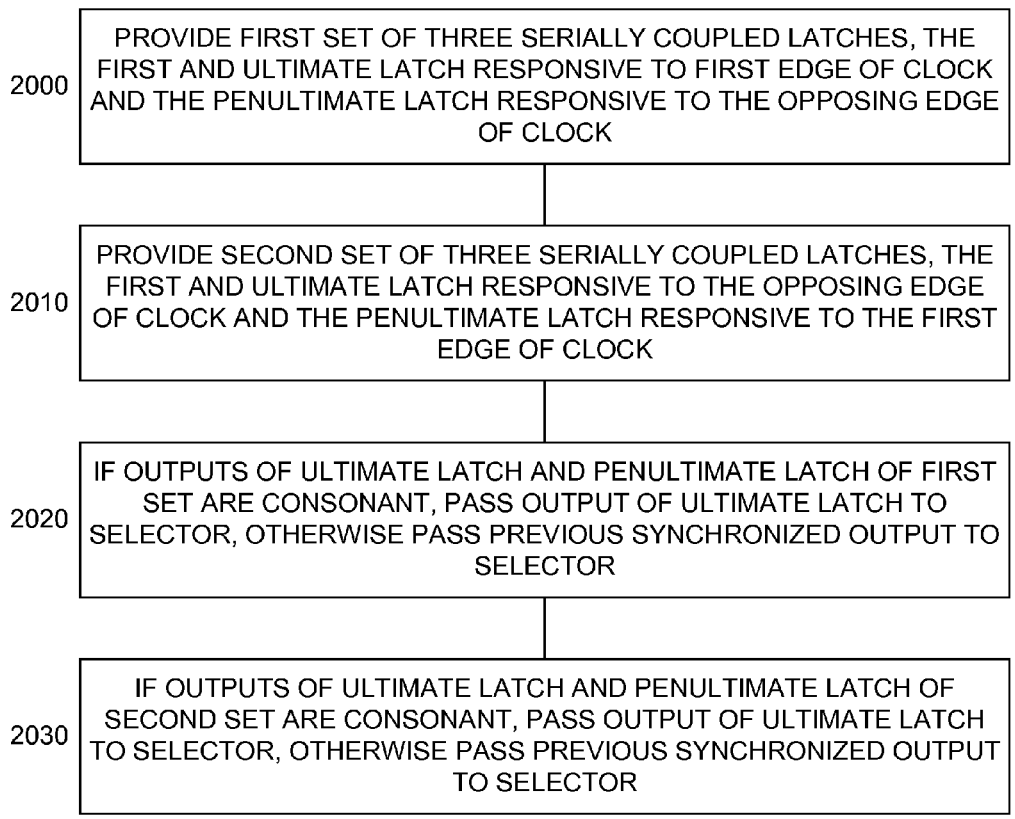
FIG. 2B illustrates a more detailed high level flow chart of a first portion of the method of FIG. 2A.

FIG. 2B illustrates a more detailed high level flow chart of a first portion of the method of FIG. 2A, specifically the confirming of stage 1010 of FIG. 2A, all the stages of FIG. 2B being optional. In stage 2000 a first set of three serially coupled latches is provided and coupled to the common clocking signal, such as first set of latches 20 of FIG. 1. The first and the ultimate latch of the provided first set are responsive to the first edge of the common clocking signal and the penultimate latch of the provided first set is responsive to the opposing edge of the common clocking signal. In stage 2010 a second set of three serially coupled latches is provided coupled to the common clocking signal, such as second set of latches 30 of FIG. 1. The first and the ultimate latch of the provided second set are responsive to the clock edge of the common clocking signal opposing the first edge and the penultimate latch of the provided second set is responsive to the first edge of the common clocking signal.

In stage 2020, in the event the output of the ultimate latch of the provided first set is consonant with the output of the penultimate latch of the provided first set, the output of the ultimate latch of the provided first set is passed to the selector of stage 1020 of FIG. 2A. Thus, the passed signal represents the input signal sampled at the first edge of the common clocking signal. In the event the output of the ultimate latch of the provided first set is not consonant with the output of the penultimate latch of the provided first set, the previous synchronized output value is passed to the selector. In one embodiment, in both events the passing is accomplished by the first filter portion of stage 1010 of FIG. 2A, as described above in relation to first filter portion 40 of FIG. 1. In stage 2030, in the event the output of the ultimate latch of the provided second set is consonant with the output of the penultimate latch of the provided second set, the output of the ultimate latch of the provided second set is passed to the selector. Thus, the passed signal represents the input signal sampled at the second edge of the common clocking signal. In the event the output of the ultimate latch of the provided second set is not consonant with the output of the penultimate latch of the provided second set, the previous synchronized output value is passed to the selector. In one embodiment, in both events the passing is accomplished by the second filter portion of stage 1010 of FIG. 2A, as described above in relation to second filter portion 50 of FIG. 1.

FIG. 2C illustrates a more detailed high level flow chart of a second portion of the method of FIG. 2A, specifically the optional selecting of stage 1020 of FIG. 2A, all the stages of FIG. 2C being optional. FIG. 2D illustrates a truth table of the outputs of specific elements of synchronizer 10 of FIG. 1, specifically first filter portion 40, second filter portion 50, AND gate 100, OR gate 110, signal DLY output by output latch 70 and output signal OUT. For the sake of clarity FIGS. 2C and 2D will be described together. In stage 3000 the passed signal of stage 2020 of FIG. 2B, associated with the first set of three serially coupled latches, is received at the selector. In one embodiment the passed signal is received at a first input of an AND gate and a first input of an OR gate, such as AND gate 100 and OR gate 110 of FIG. 1. In stage 3010 the passed signal of stage 2030 of FIG. 2B, associated with the second set of three serially coupled latches is received at the selector. In one embodiment the passed signal is received at a second input of the AND gate and a second input of the OR gate.

In stage 3020 the received signal of stage 3000 is logically ANDed with the received signal of stage 3010. In stage 3030 the received signal of stage 3000 is logically ORed with the received signal of stage 3010. In stage 3040 one of the outcome of the logically ANDing of stage 3020 and the outcome of the logically ORing of stage 3030 is selected responsive to the previous synchronized output value. In one embodiment the selecting is accomplished by a multiplexer, such as multiplexer 120 of FIG. 1, with the previous synchronized output value connected to the control input of the multiplexer. In the event that the previous synchronized output value is a logical 1, the outcome of the logically ANDing of stage 3020 is passed to the output as signal OUT. In the event that the previous synchronized output value is a logical 0, the outcome of the logically ORing of stage 3030 is passed to the output as signal OUT.

In stage 3050 the selected one of the outcome of the logically ANDing of stage 3020 and the outcome of the logically ORing of stage 3030, selected in stage 3040, is latched and represents the previous synchronized output value, i.e. signal DLY.

Thus certain of the present embodiments enable a synchronizer comprising a first set of three serially coupled latches and a second set of three serially coupled latches, each operative to sample an input signal on opposing edges of a common clocking signal. The output of each of the first set of latches and second set of latches is connected to a respective filter portion which is operative to output the sampled input signal only if the input signal is consistent for two consecutive opposing edges of the common clocking signal. The output of each filter portion is connected to a respective input of a selector which is operative to output the sampled input signal responsive to a previous synchronized output value.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. A synchronizer comprising:
   a first set of three serially coupled latches coupled to a common clocking signal, the first and the ultimate latch of said first set responsive to a first edge of a common clocking signal to transfer a respective signal appearing at the respective latch input to the respective latch output and the penultimate latch of said first set responsive to a second edge of the common clocking signal to transfer a respective signal appearing at the respective latch input to the respective latch output, the second edge opposing the first edge;
   a second set of three serially coupled latches coupled to the common clocking signal, the first and the ultimate latch of said second set responsive to the second edge of the common clocking signal to transfer a respective signal appearing at the respective latch input to the respective latch output and the penultimate latch of said second set responsive to the first edge of the common clocking signal to transfer a respective signal appearing at the penultimate latch input to the penultimate latch output;
   an input lead arranged to receive an input signal to be synchronized, said input lead coupled to the input of the first latch of said first set and to the input of the first latch of said second set; and
   a filter arranged to pass the output of each of said first set and said second set responsive to the penultimate latch of the set exhibiting a consonant output for two consecutive opposing edges of the common clocking signal.

2. The synchronizer of claim 1, further comprising a selector coupled to the output of said filter, said selector arranged to pass an output of said filter responsive to a previous output value of the synchronizer.

3. The synchronizer of claim 1, wherein said filter comprises:
   a first filter portion arranged to pass the output of the ultimate latch of said first set in the event that the output of the ultimate latch of said first set is consonant with the output of the penultimate latch of said first set; and
   a second filter portion arranged to pass the output of the ultimate latch of said second set in the event that the output of the ultimate latch of said second set is consonant with the output of the penultimate latch of said second set.

4. The synchronizer of claim 3, wherein each of said first filter portion and second filter portion comprises:
   an exclusive or gate, the inputs of said exclusive or gate coupled to the outputs of the ultimate latch and the penultimate latch of said respective set; and
   a multiplexer, a first input of said multiplexer coupled to the output of the ultimate latch of said respective set, said multiplexer arranged to selectively pass one of the first input and a second input to the output of said multiplexer responsive to said exclusive or gate.

5. The synchronizer of claim 4, wherein the second input of each of said respective multiplexer of said first filter portion and said second filter portion is coupled to a previous output value of the synchronizer.

6. The synchronizer of claim 3, wherein said first filter portion is arranged to output a previous output value of the synchronizer in the event that the output of the ultimate latch of said first set is not consonant with the output of the penultimate latch of said first set.

7. The synchronizer of claim 6, wherein said second filter portion is arranged to output a previous output value in the event that the output of the ultimate latch of said second set is not consonant with the output of the penultimate latch of said second set.

8. The synchronizer of claim 3, further comprising:
a selector arranged to alternately pass the output of said first filter portion or said second filter portion responsive to a previous output value.

9. The synchronizer of claim 8, wherein said selector comprises:
an AND gate, the inputs of said AND gate coupled to the output of said first filter portion and the output of said second filter portion;
an OR gate, the inputs of said OR gate coupled to the output of said first filter portion and the output of said second filter portion; and
a multiplexer, the inputs of said multiplexer coupled to the output of said AND gate and the output of said OR gate, said multiplexer selecting the input to be passed to the output of the synchronizer responsive to the previous output value.

10. The synchronizer of claim 9, further comprising an output latch responsive to the common clocking signal, the input of said output latch coupled to the output of said multiplexer, the previous output value provided by the output of said output latch.

11. A method of synchronizing an input signal, the method comprising:
sampling the input signal at both a first edge and a second edge of a common clocking signal, said second edge opposing said first edge;
confirming that said sampled input signal is of a consistent value for two consecutive opposing edges of the common clocking signal; and
outputting a signal responsive to a previous synchronized output value and said confirmed sampled input signal.

12. The method of claim 11, wherein said outputting a signal comprises:
selecting one of the input signal sampled at the first edge of the common clocking signal and the input signal sampled at the second edge of the common clocking signal responsive to a previous synchronized output value.

13. The method of claim 12, wherein said confirming comprises:
providing a first set of three serially coupled latches coupled to the common clocking signal, the first and the ultimate latch of said provided first set responsive to the first edge of the common clocking signal to transfer a respective signal appearing at the respective latch input to the respective latch output and the penultimate latch of said provided first set responsive to the second edge of the common clocking signal to transfer a respective signal appearing at the respective latch input to the respective latch output;
providing a second set of three serially coupled latches coupled to the common clocking signal, the first and the ultimate latch of said provided second set responsive to the second edge of the common clocking signal to transfer a respective signal appearing at the respective latch input to the respective latch output and the penultimate latch of said provided second set responsive to the first edge of the common clocking signal to transfer a respective signal appearing at the penultimate latch input to the penultimate latch output;
passing the output of the ultimate latch of said provided first set towards a selector in the event that the output of the ultimate latch of said provided first set is consonant with the output of the penultimate latch of said provided first set; and
passing the output of the ultimate latch of said provided second set towards the selector in the event that the output of the ultimate latch of said provided second set is consonant with the output of the penultimate latch of said provided second set.

14. The method of claim 13, further comprising:
passing the previous synchronized output value towards the selector in the event that the output of the ultimate latch of said provided first set is not consonant with the output of the penultimate latch of said provided first set.

15. The method of claim 14, further comprising:
passing the previous synchronized output value towards the selector in the event that the output of the ultimate latch of said provided second set is not consonant with the output of the penultimate latch of said provided second set.

16. The method of claim 13, wherein said outputting a signal comprises:
selecting one of the passed signal associated with said provided first set and the passed signal associated with said provided second set responsive to the previous synchronized output value.

17. The method of claim 16, wherein said selecting comprises:
receiving the passed signal associated with said provided first set;
receiving the passed signal associated with said provided second set;
logically ANDing the received signal associated with said provided first set with the received signal associated with said provided second set;
logically ORing the received signal associated with said provided first set with the received signal associated with said provided second set; and
selecting one of the outcome of the logically ANDing and the logically ORing responsive to the previous synchronized output value.

18. The method of claim 17, further comprising latching the selected one of the outcome of the logically ANDing and the logically ORing, the latched selected one representing the previous synchronized output value.

19. A synchronizer comprising:
a first set of three serially coupled latches coupled to a common clocking signal, the first and the ultimate latch of said first set responsive to a first edge of a common clocking signal to transfer a respective signal appearing at the respective latch input to the respective latch output and the penultimate latch of said first set responsive to a second edge of the common clocking signal to transfer a respective signal appearing at the respective latch input to the respective latch output, the second edge opposing the first edge;
a second set of three serially coupled latches coupled to the common clocking signal, the first and the ultimate latch of said second set responsive to the second edge of the common clocking signal to transfer a respective signal appearing at the respective latch input to the respective latch output and the penultimate latch of said second set responsive to the first edge of the common clocking signal to transfer a respective signal appearing at the penultimate latch input to the penultimate latch output;

a means for receiving an input signal to be synchronized, said means for receiving coupled to the input of the first latch of said first set and to the input of the first latch of said second set; and a filter arranged to pass the output of each of said first set and said second set responsive to the penultimate latch of the set exhibiting a consonant output for two consecutive opposing edges of the common clocking signal.

20. The synchronizer of claim 19, further comprising a selector coupled to the output of said filter, said selector arranged to pass an output of said filter responsive to a previous output value of the synchronizer.

21. The synchronizer of claim 20, wherein said filter comprises:
- a first filter portion arranged to pass the output of the ultimate latch of said first set in the event that the output of the ultimate latch of said first set is consonant with the output of the penultimate latch of said first set; and
- a second filter portion arranged to pass the output of the ultimate latch of said second set in the event that the output of the ultimate latch of said second set is consonant with the output of the penultimate latch of said second set.

* * * * *